(12) United States Patent
Charlat

(10) Patent No.: US 7,638,972 B2
(45) Date of Patent: Dec. 29, 2009

(54) SYSTEM FOR MONITORING A GROUP OF ELECTROCHEMICAL CELLS AND DEVICE THEREFOR

(75) Inventor: Pierre Charlat, Lans en Vercors (FR)

(73) Assignee: L'Air Liquide - Societe Anonyme a Directoire et Conseil de Surveillance pour l'Etude et l'Exploitation des Procedes Georges Claude, Paris (FR)

( * ) Notice: Subject to any disclaimer, the term of this patent is extended or adjusted under 35 U.S.C. 154(b) by 181 days.

(21) Appl. No.: 11/569,793

(22) PCT Filed: May 17, 2005

(86) PCT No.: PCT/FR2005/050332

§ 371 (c)(1),
(2), (4) Date: Dec. 12, 2007

(87) PCT Pub. No.: WO2006/003332

PCT Pub. Date: Jan. 12, 2006

(65) Prior Publication Data

US 2008/0197852 A1     Aug. 21, 2008

(30) Foreign Application Priority Data

Jun. 16, 2004   (FR) .................................. 04 06523

(51) Int. Cl.
*H02J 7/00* (2006.01)
(52) U.S. Cl. ..................... 320/118; 320/127
(58) Field of Classification Search ................ 320/118, 320/127; 324/434
See application file for complete search history.

(56) References Cited

U.S. PATENT DOCUMENTS 6,677,066 B1     1/2004   Jansen et al.

FOREIGN PATENT DOCUMENTS

| CA | 2 398 727 | 8/2000 |
|---|---|---|
| DE | 199 07 369 | 8/2000 |
| DE | 100 43 139 | 3/2002 |
| DE | 100 59 392 | 6/2002 |
| GB | 1 370 996 | 10/1974 |
| WO | WO 98 45889 | 10/1998 |
| WO | WO 99 67869 | 12/1999 |
| WO | WO 03 098769 | 11/2003 |

OTHER PUBLICATIONS

International Search Report for PCT/FR2005/050332.

*Primary Examiner*—Edward Tso
*Assistant Examiner*—Ahmed Omar
(74) *Attorney, Agent, or Firm*—Christopher J. Cronin

(57) ABSTRACT

A system for monitoring a group of electrochemical cells ($C_1, \ldots, C_i, \ldots, C_n$) arranged in series, wherein each cell ($C_i$) is provided for outputting a DC voltage ($V_i$) greater than a minimum value ($V_{min}$). According to the invention, said monitoring system includes a corresponding set of n electronic components ($D_1, \ldots, D_i, \ldots, D_n$) arranged in series, wherein each component ($D_i$) is biased by the DC voltage ($V_i$) of a corresponding cell ($C_i$) by means of a low-frequency connecting element ($L_i$), and has a conductivity threshold voltage ($V_s$) no lower than said minimum value ($V_{min}$); and a means (D) for measuring a high-frequency conductivity parameter of all of said components. The system is useful in fuel cells.

7 Claims, 3 Drawing Sheets

SYSTEM FOR MONITORING A GROUP OF ELECTROCHEMICAL CELLS AND DEVICE THEREFOR

The present invention relates to a system for monitoring of a group of n electrochemical cells disposed in series. It also relates to a connection device for the formation of said monitoring system.

One particularly advantageous application of the invention is in the field of fuel cells composed of an assembly of electrochemical cells electrically connected in series.

Each cell of a fuel cell delivers a DC voltage that depends on the current demand, on the operating conditions (supply of reaction agents, humidity, temperature) and on the electrochemical performance of the components. This voltage is, in normal operation, in the range between a minimum voltage of 0.5 V and 1 V.

However, due to aging or to a particular sensitivity to the operating conditions, occasionally one or more cells of the group may exhibit a voltage much lower than these values, approaching 0.2 V, or even 0 V or reversed voltages, referred to as 'negative'. This low operating voltage can induce an additional thermal stress further accelerating the aging process, or promote the appearance of perforations in the cell.

In order to solve this problem, in a known manner, monitoring of the individual voltages of the cells is adopted.

It is recalled that, without such a monitoring, only the leakage of hydrogen caused by the perforation of the cells is detected and leads to the failure being taken into account.

On the other hand, monitoring of the cell voltages allows early detection of the failure and ensures that the repair can be effected with the least possible discontinuity in the supply of power to the user.

The currently known monitoring systems are based on successive measurements of the individual voltages of the cells by means of an acquisition system connected to each of the cells and processed by computer. These systems demand complex and costly measurement means. They are all the more complicated by the fact that the differential voltage measurements across the terminals of each cell must be carried out with very high common-mode voltages, for example around 100 V for the highest voltage from a stack of 100 cells, which increases accordingly the constraints on the components and the associated architecture.

Lastly, the device for connection to the cells is generally a high-cost element.

Accordingly, the technical problem to be solved by the present invention is to provide a system for monitoring a group of n electrochemical cells disposed in series, each cell being designed to deliver a DC voltage higher than a minimum value, which would allow an efficient monitoring of the cells, but nevertheless simpler and less costly than with the known systems, to be obtained.

The solution to the technical problem posed consists, according to the present invention, in that said monitoring system comprises:
  a corresponding assembly of n electronic components disposed in series, each component being biased by the DC voltage of a corresponding cell via a low-frequency connection element, and having a conductivity threshold voltage at least equal to said minimum value,
  a means for measuring a high-frequency conductivity parameter of the assembly of said components.

Thus, the measurement of said high-frequency conductivity parameter gives a global view of the state of operation of all of the electrochemical cells. Indeed, if at least one cell of the group is defective to the point of supplying a voltage below the conductivity threshold of the corresponding electronic component, a break in the conductivity of the chain of components will occur. This break, detected by the measurement of the conductivity parameter, will indicate an anomaly and will cause the maintenance service in charge of the cell battery to intervene.

The indication of the abnormal character of the value of the measured conductivity parameter is obtained by the monitoring system owing to the fact that, according to the invention, it also comprises a comparator capable of comparing said high-frequency conductivity parameter with a given threshold level.

In one embodiment of the invention, said measured conductivity parameter is the high-frequency impedance of the whole of the components.

In one particular embodiment of the invention, said electronic components are diodes.

Lastly, as will be seen in detail hereinbelow, a connection device for the formation of a monitoring system according to the invention is noteworthy, in particular, in that said device is composed of an assembly of n linked clips, each clip supporting:
  a low-frequency connection element one end of which is connected to one terminal of a corresponding cell,
  an electronic component,
  and each clip receiving one end of the electronic component of a neighboring clip,
  the other end of the low-frequency connection element, one end of the electronic component and said end of the neighboring electronic component being connected together.

The description that follows with regard to the appended drawings, presented by way of non-limiting examples, will make the composition of the invention and how it may be constructed readily understood.

Figure 1:
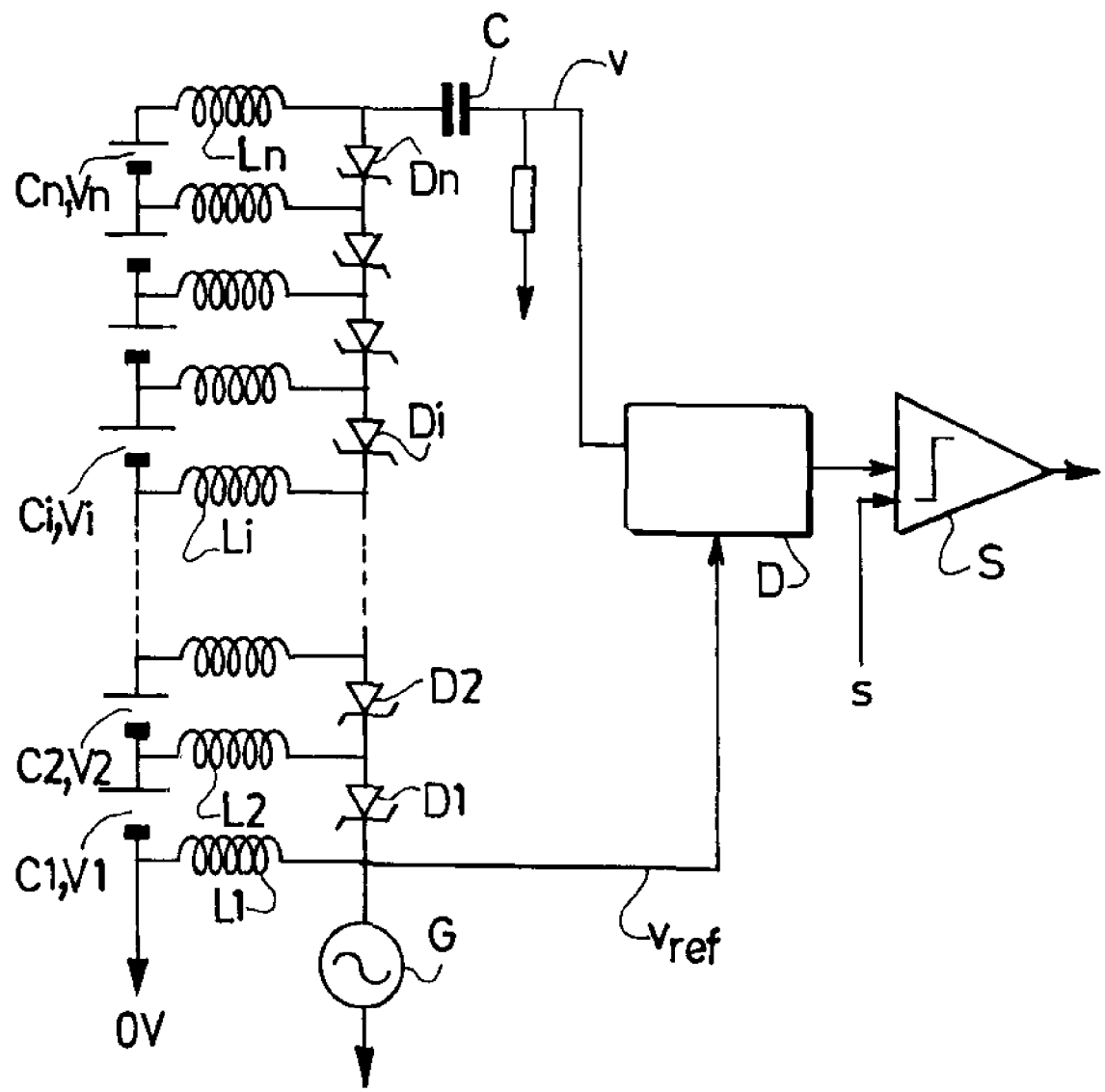
FIG. 1 is a circuit diagram of a monitoring system according to the invention.

In FIG. 1, a system for monitoring a group of n electrochemical cells disposed in series is shown. These cells, such as fuel cells, are respectively referenced $C_1$, $C_2$, ..., $C_i$, ..., $C_n$ and deliver across their terminals a DC voltage $V_1$, $V_2$, ..., $V_i$, ..., $V_n$ whose values in normal operation are greater than a minimum value Vmin of 0.2 V for example.

As can be seen in FIG. 1, said monitoring system comprises an assembly of n electronic components which, in the embodiment shown, are Schottky diodes $D_1$, $D_2$, ..., $D_i$, ..., $D_n$ disposed in series. These diodes exhibit a conductivity threshold voltage Vs from 0.3 V to 0.6 V, preferably higher than the minimum operating voltage Vmin of the cells $C_1$, $C_2$, ..., $C_i$, ..., $C_n$.

The number n of diodes is equal to the number n of cells to be evaluated, each cell $C_i$ being associated with a diode $D_1$ in the sense that each diode $D_1$ is biased by the voltage $V_1$ of the single cell $C_i$.

The biasing of the diodes is effected via low-frequency connection elements, here inductors $L_i$, placed between the series of cells $C_i$ and the series of diodes $D_i$. These inductors $L_i$ are, at low frequency and hence for DC, equivalent to closed circuits. On the other hand, at higher frequencies, they behave as open circuits and decouple the voltages across the terminals of the diodes from the DC voltages Vi across the terminals of the cells.

This property is used to advantage in order to perform a measurement of a high-frequency conductivity parameter of the assembly of diodes Di. For this purpose, a generator G applies, across the terminals of the series of diodes, an AC voltage of frequency in the range between 300 and 5000 kHz, preferably 1000 to 3000 kHz, and of amplitude in the range between 1 and 300 mV, preferably 20 to 100 mV.

The impedance, or the current, of the series of diodes Di is then measured by means of a detector D at the chosen high frequency. At these frequencies, a simple capacitor C or a coupling by mutual inductances suffices in order to decouple the reading of the impedance from the high value of the DC voltage and thus solves the 'common-mode' problem stated hereinabove.

In normal operation, the voltage Vi applied to each diode Di is higher than the threshold voltage Vs and the impedance of the assembly of diodes is equivalent to a series of resistors. On the other hand, if one or more cells no longer supplies a voltage that is sufficient to allow the biasing of the corresponding diode, then the measured impedance becomes that of an open circuit.

The value obtained for the impedance of the diodes is compared at the output of the detector D with a threshold s by a comparator S in order to allow a decision to be made as to whether the operation of the cells is normal or whether there is a problem. In this case, the necessary measures can then be taken: modifications of the operating conditions until a correct operating regime is recovered, or maintenance, . . . .

Whichever conductivity parameter is measured, impedance, current or other, the detector D employed is advantageously a synchronous detector applying a frequency reference vs taken from the generator G to the output signal v from the series of diodes and applied to the input of the generator. This type of detection allows the sensitivity of the measurement to interference to be reduced.

The inductors Li chosen are axial inductors of value in the range between 3 and 1000 µH, preferably 50 to 500 µH.

The diodes Di are of the small-signal type, preferably of the Schottky type BAT41, BAT42 or BAT43 or diodes of the type 1N4148.

Figure 2:
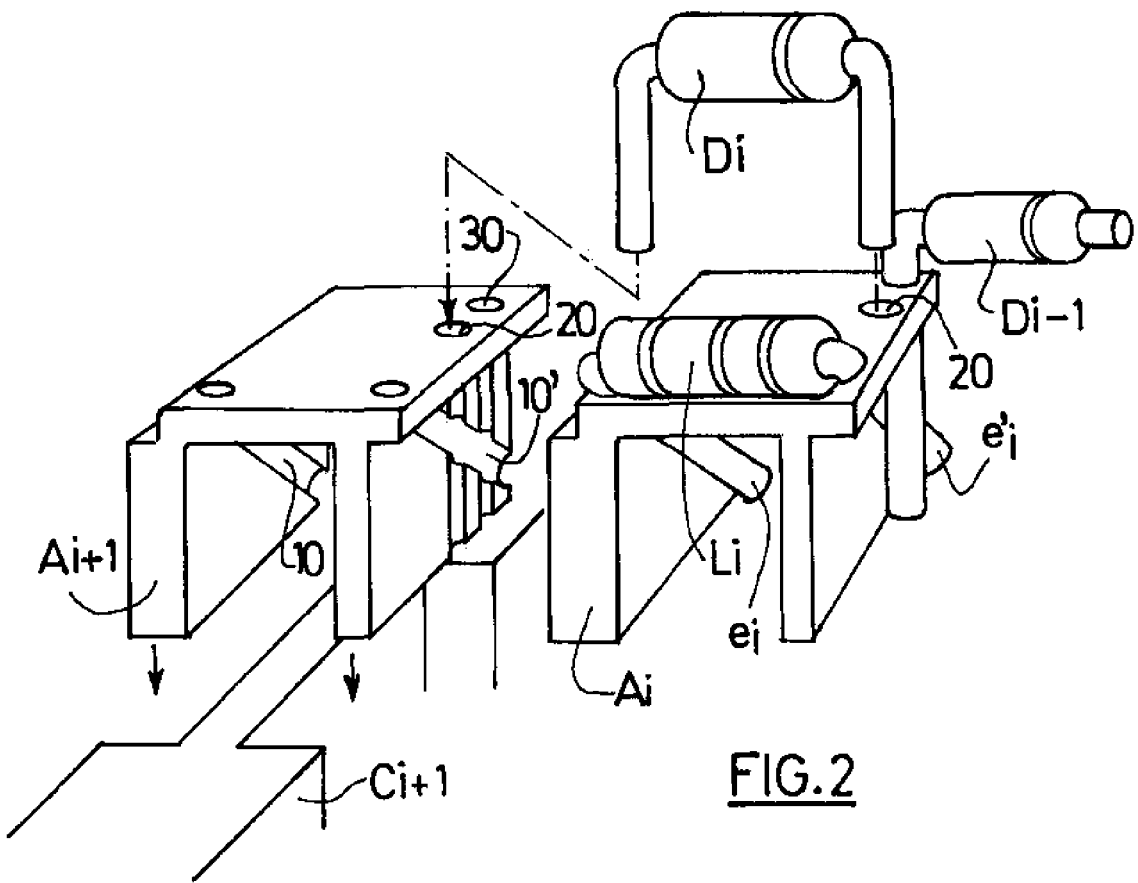
FIG. 2 is a perspective view of a clip of a connection device for the construction of the monitoring system according to the invention.

A connection device for the construction of the monitoring system in FIG. 1 is illustrated in FIG. 2.

This connection device is based on an assembly of n clips Ai, each associated with an electrochemical cell Ci.

The clips Ai are made of Elastomer or an equivalent material (Hytrel, Viton, . . . ). Each clip Ai supports, without solder, an inductor Li one end of which ei is to be connected to one terminal of the corresponding cell Ci. As indicated in FIG. 2, the connection conductors of the inductors are disposed within slots 10, 10' formed in the sidewalls of the clips.

Each clip Ai also receives, again without solder, a diode Di, a connection conductor of the diode Di being introduced into a hole 20 of the clip Ai, the other connection conductor being introduced into the corresponding hole 20 of a neighboring clip Ai+1.

Figure 3:
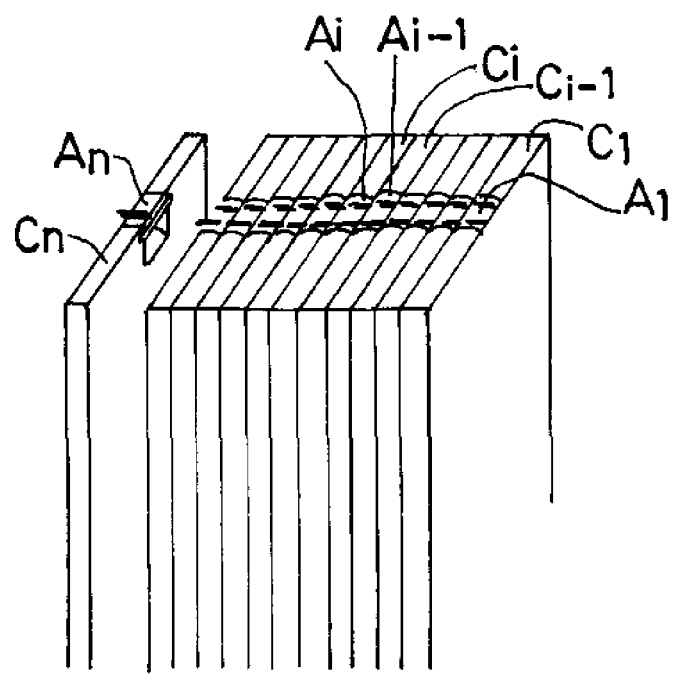
FIG. 3 is a perspective view of a connection device for the construction of the monitoring system according to the invention.

Similarly, the clip Ai receives through a hole 30 a connection conductor of the diode Di−1 from another neighboring clip Ai−1. The other end e'i of the inductor, together with the connection conductors of the diodes Di and Di−1, protrude from the clip Ai with sufficient overlap in order to allow an electrical contact to be formed between these three components by compression when the cells Ci forming the cell battery shown in FIG. 3 are assembled.

Figure 4:
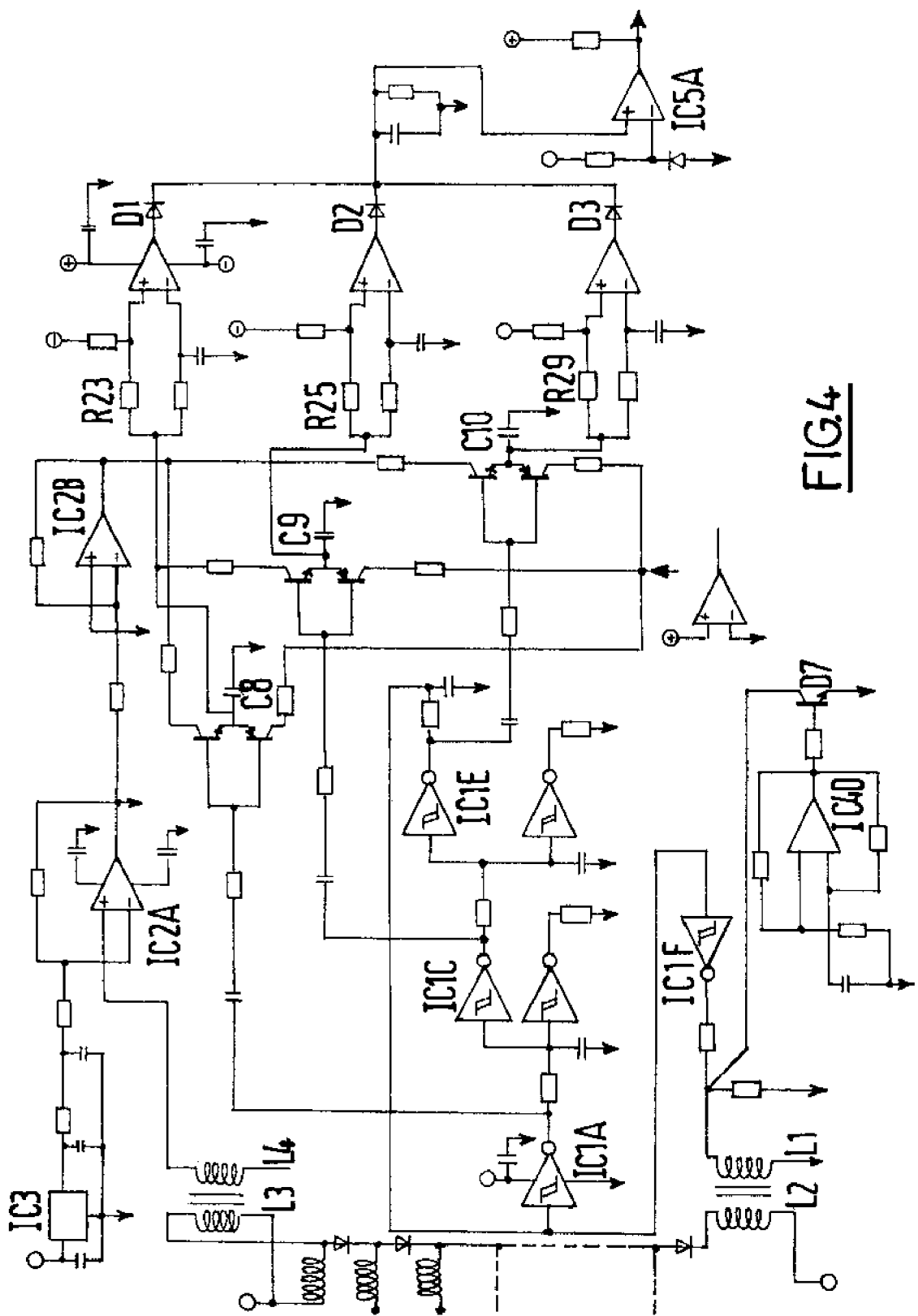
FIG. 4 is a circuit diagram of an electronic circuit for detecting a failure in one cell.

As indicated in FIG. 4, the electronic circuit for detection of the failure of one cell is composed of an assembly of three Schmitt triggers IC1A, IC1C, IC1E symmetrically connected with resistors and capacitors that allow three square-wave signals of frequency in the range between 1.5 and 3 MHz, and mutually phase-shifted by 2□/3, to be created. One of these phases is injected, after reducing its amplitude, by the circuit IC1F into an assembly of mutual inductances L1 and L2 forming a transformer.

The signal is then recovered by another assembly of mutual inductances L3 and L4, amplified and added to a constant level, generated by the circuit IC3 or by a Zener diode, using an inverter circuit with operational amplifier IC2A, the characteristics of which allow operation at frequencies in the range up to 10 MHz, for example of the type LM6172 or LM6182. A second sum, of positive voltage, is performed by inverting with a second amplifier IC2B present in the amplifier unit.

Each phase is used as biasing for an assembly of two transistors which allow a capacitor C8, C9, C10 to be alternately charged. A detection is thus effected at the precise frequency injected into the assembly of diodes connected in parallel with the cells.

The signal injection via L1 and L2 is applied and removed alternately with a frequency of around 100 Hz thanks to the circuit IC4D and the transistor Q7. A rising-edge detection on the voltages of the capacitors C8, C9 and C10, to which is added an OR function by the diodes D1, D2 and D3, then a filtering, allows an output to be generated by the circuit IC5A whose detection threshold can be adjusted by means of the resistors R23, R25 and R29.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A system for monitoring a group of n electrochemical cells (C1, . . . , Ci, . . . , Cn) disposed in series, each cell (Ci) being designed to deliver a DC voltage (Vi) higher than a minimum value (Vmin), wherein said monitoring system comprises:
    a) a corresponding assembly of n electronic components (D1, . . . , Di, . . . , Dn) disposed in series, each component (Di) being biased by the DC voltage (Vi) of a corresponding cell (Ci) via a low-frequency connection element (Li), and having a conductivity threshold voltage (Vs) at least equal to said minimum value (Vmin); and
    b) a means (D) for measuring a high-frequency conductivity parameter of the assembly of said components.

2. The monitoring system of claim 1, wherein it also comprises a comparator (S) capable of comparing said high-frequency conductivity parameter with a given threshold (s).

3. The monitoring system of claim 1, wherein said measured conductivity parameter is the high-frequency impedance of the whole of the components.

4. The monitoring system of claim 1, wherein said electronic components are diodes (Di).

5. The monitoring system of claim 1, wherein said low-frequency connection element is an inductor (Li).

6. A connection device for the construction of a monitoring system of claim 1, wherein said device is composed of an assembly of n coupled clips (A1, . . . , Ai, . . . , An), each clip (Ai) supporting:

a) a low-frequency connection element (Li) one end of which (ei) is connected to one terminal of a corresponding cell (Ci); and b) an electronic component (Di), and each clip (Ai) receiving one end of the electronic component (Di-1) of a neighboring clip (Ai-1), the other end (e'i) of the low-frequency connection element (Li), one end of the electronic component (Di) and said end of the neighboring electronic component (Di-1) being connected together.

7. The connection device of claim 6, wherein said ends are connected together by compression.

* * * * *